(12) United States Patent
Haight et al.

(10) Patent No.: US 7,759,606 B2
(45) Date of Patent: Jul. 20, 2010

(54) METHOD AND APPARATUS FOR REPAIR OF REFLECTIVE PHOTOMASKS

(75) Inventors: Richard A. Haight, Mahopac, NY (US); Peter P. Longo, Hopewell Junction, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 11/458,161

(22) Filed: Jul. 18, 2006

(65) Prior Publication Data

US 2006/0243712 A1    Nov. 2, 2006

Related U.S. Application Data

(63) Continuation of application No. 10/660,477, filed on Sep. 12, 2003, now Pat. No. 7,170,030.

(51) Int. Cl.
*B23K 26/38* (2006.01)
*B23K 26/06* (2006.01)
*G02F 2/02* (2006.01)

(52) U.S. Cl. .......................... 219/121.68; 219/121.73; 359/328

(58) Field of Classification Search ............ 219/121.68, 219/121.69, 121.73; 216/65; 372/5; 378/122; 359/327, 328, 329
See application file for complete search history.

(56) References Cited

U.S. PATENT DOCUMENTS 3,801,797 A * 4/1974 Harris et al. ................ 359/329
4,778,693 A   10/1988 Drozdowicz et al.
5,318,869 A * 6/1994 Hashimoto et al. ............ 430/5
5,656,186 A   8/1997 Mourou et al.

(Continued)

FOREIGN PATENT DOCUMENTS

JP       63-49388       3/1998

(Continued)

OTHER PUBLICATIONS

Nolte et al., "Nanostructuring with spatially localized femtosecond laser pulses", Jul. 1999, Optics Letters, vol. 24, No. 13, pp. 914-916.*

(Continued)

*Primary Examiner*—Geoffrey S Evans
(74) *Attorney, Agent, or Firm*—Connolly Bove Lodge & Hutz LLP; Daniel P. Morris

(57) ABSTRACT

A method of selectively ablating an undesired material from a substrate includes providing a substrate with two regions; providing laser pulses; tuning a wavelength of the laser pulses to match a desired wavelength characteristic of a material and directing the tuned laser pulses onto the substrate; and controlling a pulse duration, wavelength, or both, of the laser pulses to ablate the undesired material without damaging the substrate or any adjacent material. In another embodiment, an apparatus for repairing a defect on a reflective photomask includes a femtosecond pulse width laser; a harmonic conversion cell; a filter for passing a selected EUV harmonic of the laser light; a lens arrangement configured to direct the selected EUV harmonic of the laser light onto the photomask; and a control unit connected to the laser to control an ablation of the defect on the reflective photomask.

3 Claims, 9 Drawing Sheets

U.S. PATENT DOCUMENTS

| | | | |
|---|---|---|---|
| 6,050,907 A | 4/2000 | Long | |
| 6,091,749 A * | 7/2000 | Hoffmaster et al. | 372/38.02 |
| 6,156,461 A | 12/2000 | Grenon et al. | |
| 6,165,649 A | 12/2000 | Grenon et al. | |
| 6,190,836 B1 | 2/2001 | Grenon et al. | |
| 6,333,485 B1 | 12/2001 | Haight et al. | |
| 6,341,009 B1 * | 1/2002 | O'Connor et al. | 250/559.45 |
| 6,653,210 B2 * | 11/2003 | Choo et al. | 219/121.72 |
| 6,770,843 B2 * | 8/2004 | Nakai et al. | 219/121.73 |
| 6,879,605 B2 * | 4/2005 | Kyusho et al. | 372/25 |
| 6,968,038 B2 | 11/2005 | Nam et al. | |
| 2001/0031960 A1 * | 10/2001 | Kliewer et al. | 606/5 |
| 2002/0086245 A1 | 7/2002 | Zait et al. | |
| 2002/0172235 A1 | 11/2002 | Chang et al. | |
| 2003/0019852 A1 * | 1/2003 | Kaplan et al. | 219/121.68 |
| 2003/0111447 A1 * | 6/2003 | Corkum et al. | 219/121.69 |
| 2003/0213770 A1 * | 11/2003 | Yamada et al. | 216/65 |
| 2004/0102765 A1 * | 5/2004 | Koenig | 606/5 |
| 2004/0125828 A1 | 7/2004 | Alon et al. | |
| 2005/0084767 A1 | 4/2005 | Zait et al. | |

FOREIGN PATENT DOCUMENTS

| | | | |
|---|---|---|---|
| JP | 2001-5167 A * | 1/2001 | |
| WO | WO-02/076355 A1 * | 10/2002 | |
| WO | WO-03/022506 | 3/2003 | |

OTHER PUBLICATIONS

Shani et al., "High Resoloution Near-Field mask repair with a femto second laser", Sep. 1998, SPIE, vol. 3546, pp. 112-120.*

Machine translation of Japan Patent No. 2001-5,167, Sep. 2009.*

Lsio et al., "Harmonic Generation in an ionized gas medium with 100 femtosecond, high repetition rate laser source at intermediate intensities" Dec. 1997, Appl. Phys. B 64, pp. 323-330.*

MARS2: An Advanced Femtosecond Laser Mask Repair Tool, A. Wagner, R. Haight, P. Longo, SPIE, 42, 457 (2002).

Femtosecond Laser Mask Repair, A. Wagner, R. Haight, P. Longo, M. Schmidt, P. Flanigan, D. Thibault, Microlithog. World, 12, 6, 2003.

Femtosecond Lasers Repair Photomasks, R. Haight, P. Longo, A. Wagner, Laser Focus World, May 2002.

MARS: A Femtosecond Laser Mask Advanced Repair System in Manufacturing, R. Haight, D. Hayden, P. Longo, T. Neary, A. Wagner, J. Vac. Sci. Technol., B 17, 3137 (1999).

Implementation and Performance of a Femtosecond Laser Mask Repair System in Manufacturing, R. Haight, D. Hayden, P. Longo, T. Neary, A. Wagner, SPIE, 3546, 477, 1998.

Li X.F. et al. "Multiple-harmonic generation in rare gases at high laser intensity" Physical Review A (General Physics), Jun. 1989, USA, vol. 39, No. 11, pp. 5751-5761.

Miyazaki K. et al. High-order harmonic generation in the soft X-ray to XUV by ultrashort laser pulses, Lasers and Electro-optics society Annual Meeting, 1993. Leos '93 Conference Proceedings. IEEE San Jose Ca, USA 15-18 pp. 758-759.

Sekikawa T. et al., "Femtosecond extreme-ultraviolet quasi-continuum generation by an intense femtosecond Ti:sapphire laser" Journal of the Optical Society of America B (Optical Physics), Apr. 1998, vol. 15, No. 4, pp. 1406-1409.

* cited by examiner

METHOD AND APPARATUS FOR REPAIR OF REFLECTIVE PHOTOMASKS

CROSS REFERENCE TO RELATED APPLICATIONS

This Application is a Continuation under 35 U.S.C. § 120 of application 10/660,477 filed on Sep. 12, 2003, now U.S. Pat. No. 7,170,030 the entire contents of which are incorporated herein by reference.

BACKGROUND

This invention generally relates to an apparatus and method for removal of materials using laser light. More particularly, it relates to matching the wavelength of an ultrashort laser pulse to the absorption characteristics of the material being removed, in order to enhance the removal or ablation of one material, while leaving adjacent materials with different absorption properties undisturbed. Even more particularly, it relates to the use of ultrashort duration laser pulses to repair opaque defects on reflective photomasks. More particularly it relates to the removal of defects on reflective photomasks by matching the wavelengths of the ablative laser light to the peak of the reflectance of the underlying photomask substrate.

Photomasks are extensively used in the fabrication of integrated circuits on semiconductor wafers. While standard photomasks include a patterned absorbing or opaque film on a transparent substrate, a reflective mask includes a reflective substrate coated with an absorbing, opaque, or lower reflectivity patterned material. A metal, such as chromium, having a thickness on the order of about 1000 Å, is often used as the opaque or absorbing film. Other examples of absorbing or non-reflective materials include TaN, TaSiN and TaBN.

Fabrication of reflective photomasks first involves production of a reflective substrate. In the visible range of wavelengths, the substrate may be a piece of glass or other stable material. The substrate is then coated with an alternating series of dielectric films to form a reflective stack. Materials, whose optical thickness corresponds to one-quarter of the wavelength of the incident light, are deposited in layers onto the substrate to form a multilayer coating. The layered materials have alternating relatively high and low dielectric constants such that the reflected wavefronts from each interface constructively interfere in the backward or reflected direction. Reflectivities can approach 100% in the deep ultraviolet (UV), UV, visible, and near infrared (IR) regions of the optical spectrum. In some cases, the reflective substrate may be a metal which is highly reflective at a particular wavelength of light.

This construct may work effectively in a vacuum and in extreme ultraviolet ("EUV") regions of the optical spectrum as well. In those cases, multilayer films can be made with alternating layers of absorbing and non-absorbing films, where thin layers of absorbing films are positioned at the node of the standing wave field within the multilayer stack. A phase shift of 180 degrees on reflection from each film produces constructive interference in the backward or reflecting direction. Reflectivities can approach 70-80% in the EUV region of the optical spectrum.

Upon production of the reflective substrate, an absorbing or non-reflective material, as mentioned above, is then deposited onto the substrate, followed by an electron beam or photon beam sensitive organic resist. The resist is exposed with a high resolution technique, such as an electron beam, and developed to form the desired pattern in the resist. This pattern is then transferred into the absorber by etching, leaving both opaque/non-reflective and reflective regions on the mask.

The above-described conventional photomask manufacturing process usually results in at least some imperfections, and defects are therefore frequently encountered during inspection of the photomasks. In advanced mask production, the defect rate per mask approaches 100%, which is unacceptable for cost-effective manufacturing. Defects are categorized as either "clear defects" or "opaque defects". Clear defects are regions designed to have the absorber present, but which actually do not have absorber. Opaque defects are regions designed to be clear of absorber, but which actually do have absorber. FIG. 1 illustrates typical defects found on photomasks, such as a bridge defect, a bump or extension defect, or an isolated defect.

When a defect is a bridge defect connected to an adjacent absorber line, as in FIG. 1, conventional laser ablation may damage that adjacent line, undesirably removing some wanted absorber from the line. In addition, because a relatively high amount of thermal energy can be transmitted with the laser beam, the laser ablation step not only melts and vaporizes the unwanted metal defect region, it may also damage and remove a layer of substrate underlying and adjacent the opaque defect, producing roughness in the substrate. This damaged region of the quartz or glass substrate is also responsible for reduced reflectivity and altered phase of reflected light.

As an alternative to laser ablation, conventional focused ion beam (FIB) techniques offer a very controlled process for sputtering a small region of unwanted material. The ion beam can, in principle, be focused to a much smaller size than the laser beam. In addition, the ion beam physically sputters material, transmitting very little thermal energy to the mask. However there are a number of problems that limit the use of FIB for mask repair.

If the substrate is insulating, the ion beam rapidly charges the surface, and both the ability to aim subsequent ions and to use the ion beam to image the results is degraded. Second, while an opaque defect is being removed, substrate at the edge of the defect is attacked at the same rate, and the result is a "river bed" or trench of damaged substrate around the defect. The substrate in this region has altered reflectance and phase. Third, the focused ion beam species is typically gallium, and gallium has been found implanted into the substrate when the opaque defect is removed, causing reflectance losses. Fourth, the sputtering of material by the ion beam leads to ejection of material in all directions, and some of this ejected material may come to rest on adjacent edges.

A more general problem involves the ablation of a specific material, patterned or otherwise, that resides in a matrix of other materials, without damaging the desirable materials surrounding the specific material to be removed. What is needed then is an ablation process and apparatus or device that could be tuned to specific absorption properties of materials, thereby permitting the removal of one material, while leaving other materials in the matrix undisturbed.

SUMMARY

In this disclosure, we describe a method and apparatus that solves conventional problems which, in various aspects of embodiments of the invention, direct a relatively short pulse of light tuned to the wavelength of highest reflectivity of the substrate, and which ablates the absorbing defect in a non-thermal process which removes the defect without damaging the underlying reflective substrate.

In one aspect of the invention, defects in the patterned absorber atop a reflective substrate can be removed by directing an intense ultrashort duration laser pulse just above the defect in order to ablatively remove it, without damaging the underlying reflective mask. Another aspect of the invention provides a general method of performing an ablative process that leads to the specific removal of material. Another aspect of this invention provides a method of removing specific material imbedded in a matrix of different materials, without any repair induced damage or substrate pitting. In various aspects of embodiments of the invention, a mask may be repaired without degradation of reflectance in the defect region or in the region adjacent thereto.

In one embodiment of the invention, a method of selectively ablating material includes providing a substrate underlying regions of at least two different materials; providing laser pulses having tunable wavelengths; tuning the laser pulses to a wavelength corresponding to a desired material characteristic of at least one of the at least two materials; and shining the tuned laser pulses onto the regions of at least two materials until a portion of one of the at least two materials is ablated from the substrate. Tuning may include tuning the wavelength of the laser pulses to approximate a peak absorption wavelength or a peak reflection wavelength of one of the at least two materials. The laser pulses may be tuned to remove the portion of the at least two materials without damaging the underlying substrate. The pulse width of the laser pulses may be controlled, along with the wavelength, or both, to control an amount of energy applied to the materials or substrate.

In another embodiment, a method of producing an essentially defect-free photomask for semiconductor applications includes providing a substrate including a surface having an absorbing layer patterned thereon as a mask to yield a circuit when transferred to a resist coated wafer; inspecting the mask and detecting a defect on the mask in a defect region; and directing energy on said defect region and removing a substantial portion of said defect. The mask may include a reflective substrate, such as a reflective metal, a reflective substrate having a stack of dielectric layers arranged to be reflective at a specified wavelength of light, reflective substrate having a single layer of material reflective in a visible region of light, or a reflective substrate having multiple layers of material reflective in a visible region of light.

In another embodiment of the invention, a method of repairing a defect on a mask includes providing a reflective substrate comprising the mask which includes a first region and a second region, wherein a light absorbing first material covers the first region and the second region is free of the light absorbing material; inspecting the mask and detecting an essentially opaque defect on the mask in a defect region; shining a plurality of laser pulses on the defect region to ablate the defect after selecting a laser pulse duration; and removing the defect without damaging the reflective substrate underlying the defect. In this aspect, the absorbing region may have an edge with an edge placement tolerance, wherein removing the defect leaves the edge of the absorbing region within the edge placement tolerance. The placement tolerance may be 10% or less, and the defect may be removed without splattering any defect material on the substrate, or without pitting the substrate.

In another embodiment of the invention, a method of removing material from a reflective substrate includes providing a reflective substrate having a region with a non-reflective or absorbing material thereon; and shining a plurality of laser pulses on said non-reflective or absorbing region to remove said material without damaging said reflective substrate underlying said material. The reflective substrate may be a mask, and the material may be a defect in a mask, which may include chrome or molybdenum or similar materials, for example.

Another embodiment of the invention is an apparatus for repairing a defect on a reflective photomask including a laser capable of providing femtosecond pulse width laser light; a harmonic conversion cell optically coupled to the laser; a filter for blocking a fundamental wavelength and passing a selected harmonic of the laser light; an objective lens arrangement configured to provide the selected harmonic of the laser light onto the reflective photomask; and a control unit operatively connected to the laser to control an ablation of the defect on the reflective photomask. The selected harmonic may be at an EUV wavelength, or other harmonic wavelength of interest.

BRIEF DESCRIPTION OF THE DRAWINGS

The various features and advantages of the invention will be more readily understood upon consideration of the following detailed description of the invention, taken in conjunction with the accompanying drawings in which.

DETAILED DESCRIPTION

It should be noted with the disclosure herein that the use of prepositions, such as "on", "over", and "under", are defined with respect to a planar surface of the mask, regardless of the orientation in which the mask is actually held. A layer may be considered to be "on" another layer even if there are intervening layers.

The method of one embodiment of the invention ablatively removes specific material using ultrashort pulses of laser light. By tuning the laser output wavelength to match or be set within a specific offset of a wavelength specific absorption of the material that is desired to be removed, discrimination between this particular material and adjacent desirable materials, all or part of which may be embedded in a matrix, can be achieved.

Figure 1:
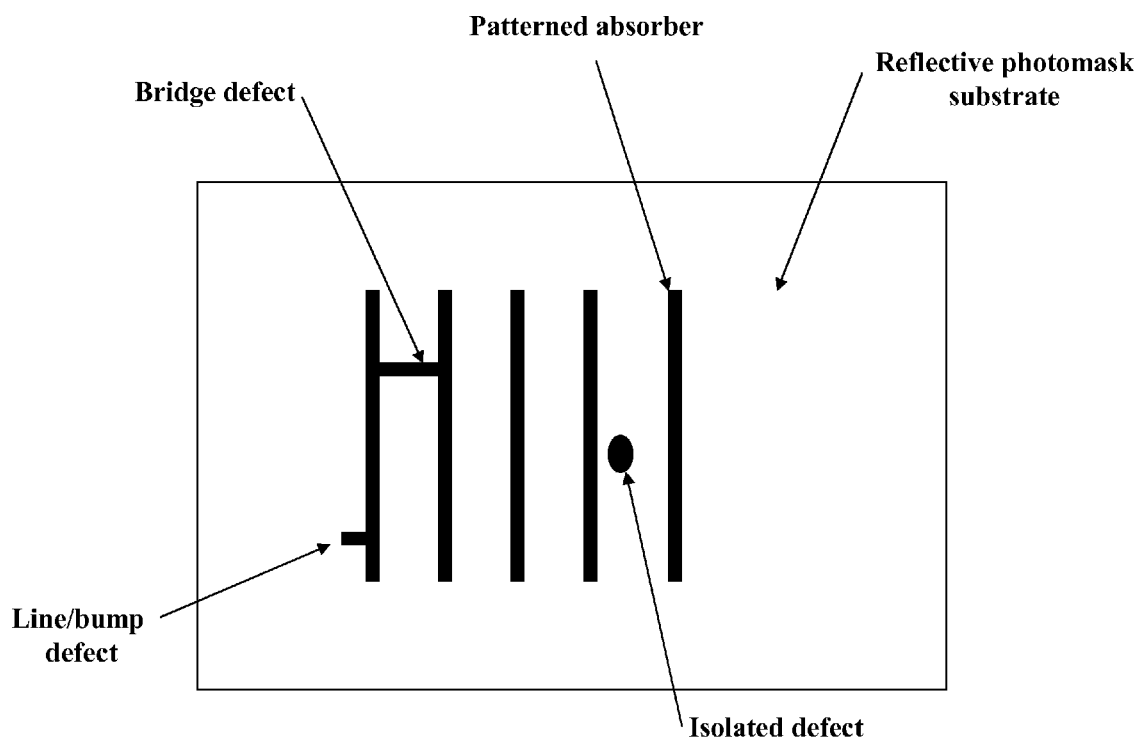
FIG. 1 illustrates examples of typical defects including a typical "bridge" defect, a typical line/bump defect and a typical isolated absorber defect on an otherwise reflective photomask substrate field.
Figure 2A:
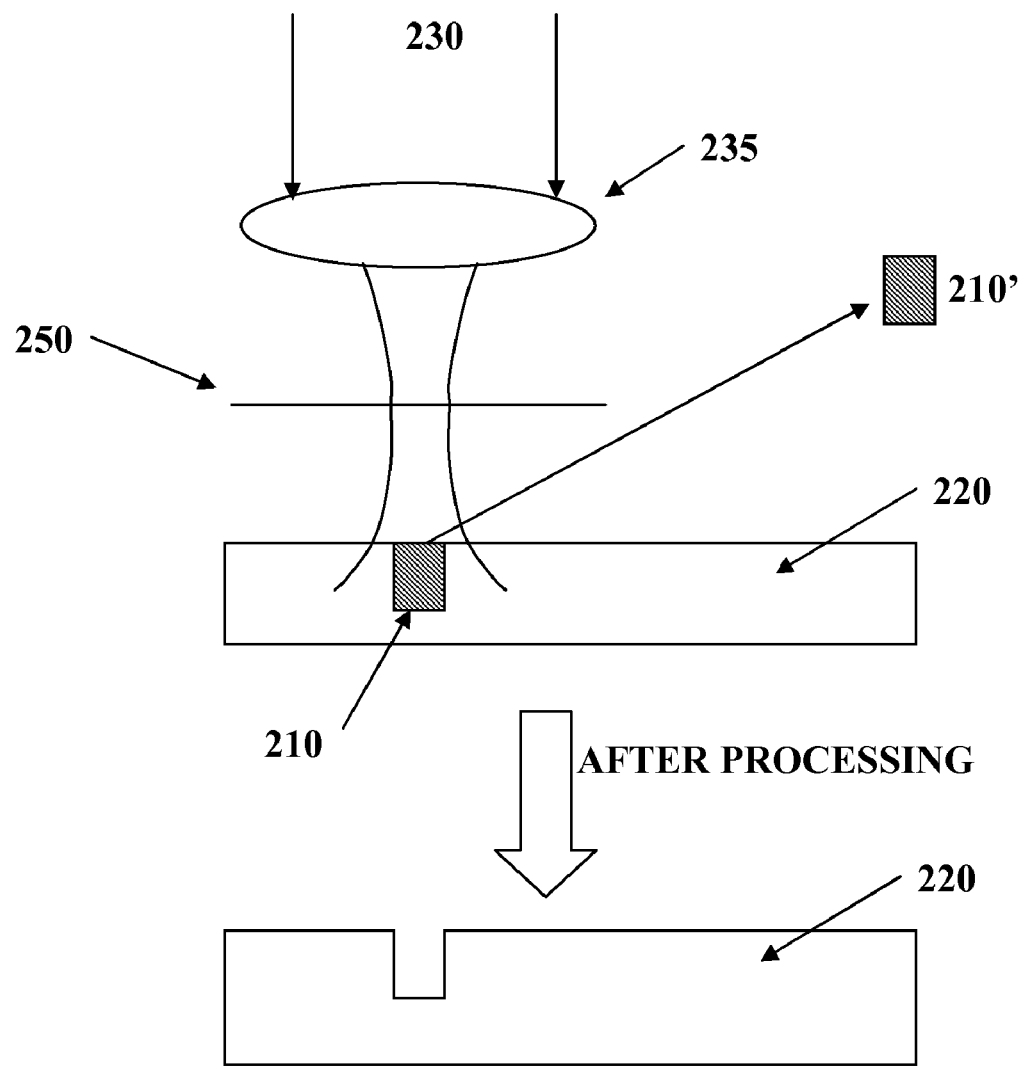
FIG. 2A represents the ablative removal of a first material embedded in a different second material using a short pulse of laser light focused just above the surface of the materials.
Figure 2B:
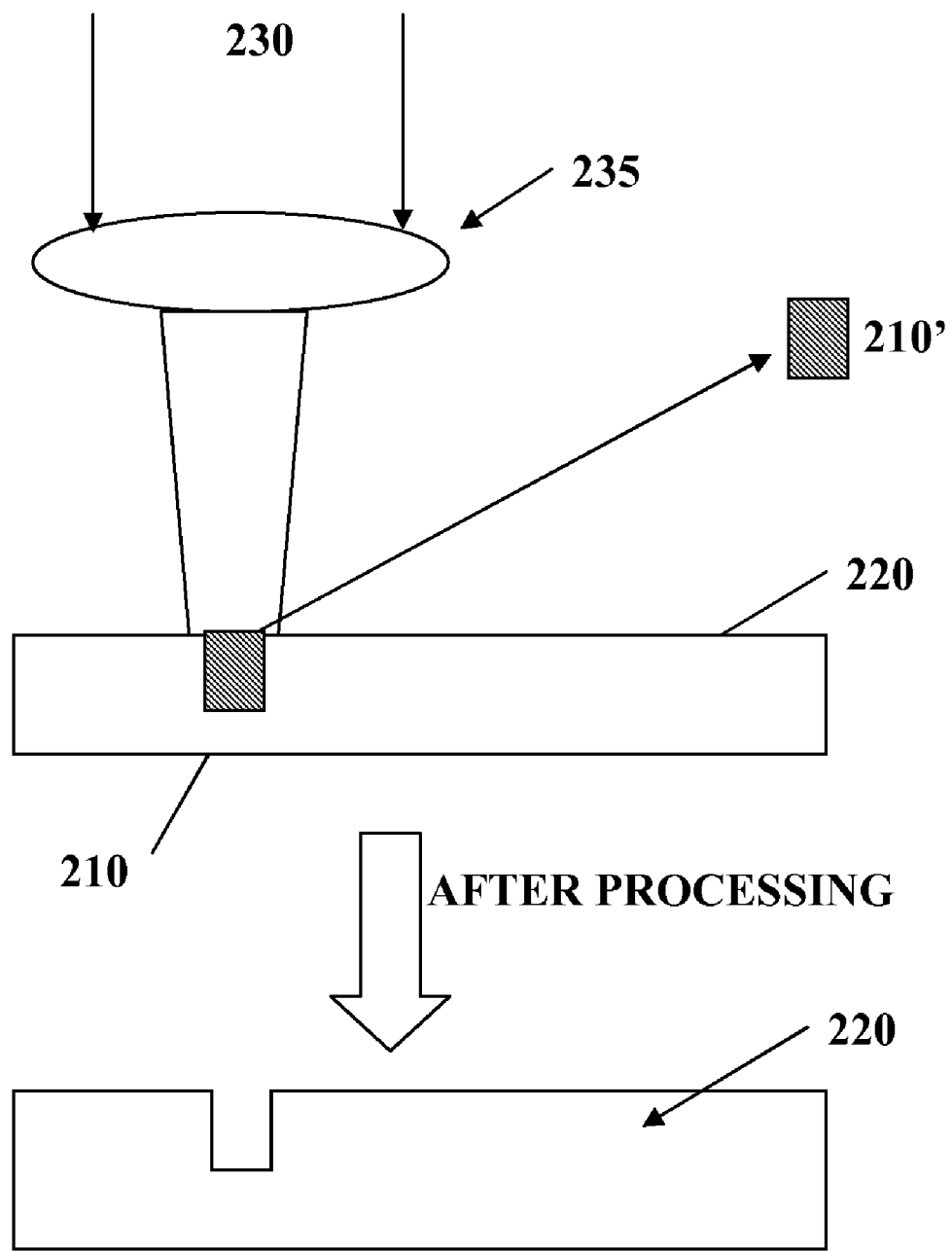
FIG. 2B represents the ablative removal of a first material embedded in a different second material using a short pulse of laser light focused directly on or near the surface of the materials.

For example, and with reference to FIGS. 2A and 2B, if a first material 210 possesses an atomic core level at energy $E_1$, and if a second material 220 possesses an atomic core level at $E_2$, by tuning the wavelength of ultrashort laser pulse 230 such that its energy is essentially matched to the wavelength at which material 210 has a peak energy absorption, material 210 will be removed as ablated material 210', while material 220 will be left unaffected. Materials 210 and 220 may be either elemental or compound materials. In one aspect of this embodiment depicted in FIG. 2A, laser pulse 230 may be focused through lens 235 at focal plane 250 just above the exposed surface of materials 210 and 220, or, as depicted in FIG. 2B, laser pulse 230 may be focused on or near the exposed surface of materials 210 and 220.

In this context, the term "ultrashort" may include pulses on the order of a femtosecond, i.e., a quadrillionth ($10^{-15}$) of a second, for example.

Figure 3A:
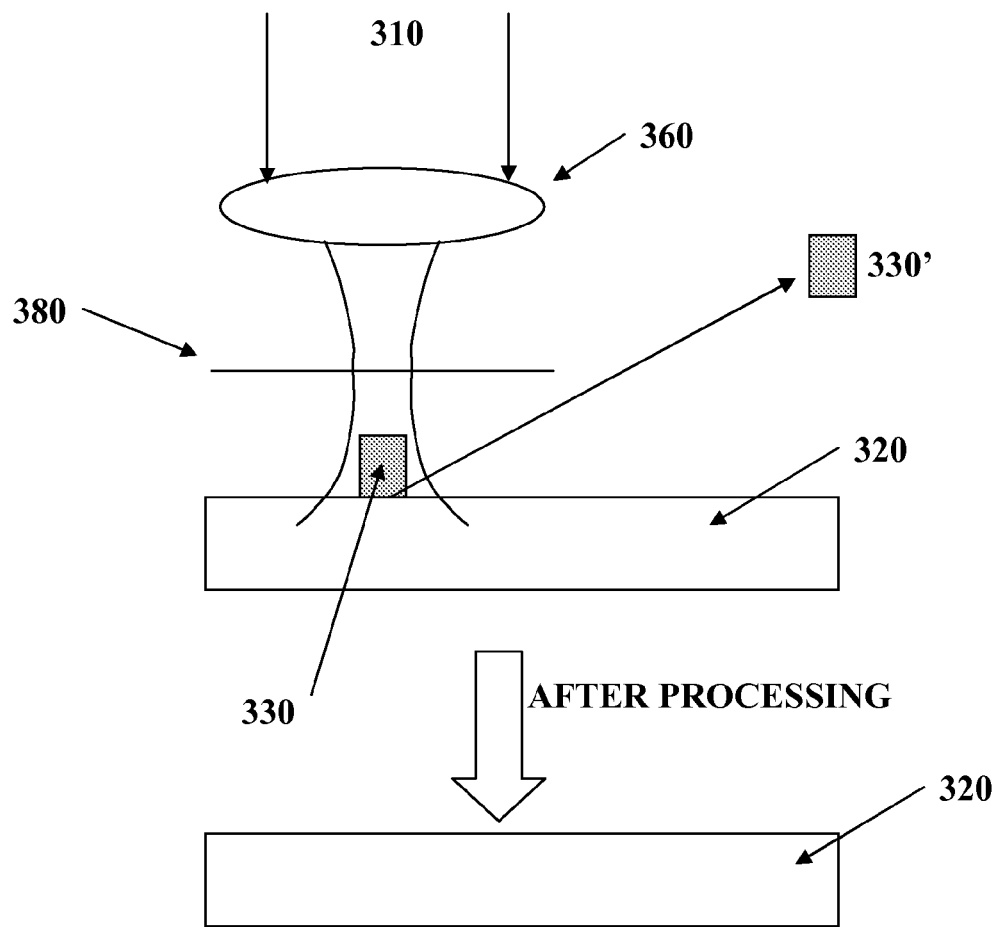
FIG. 3A represents the irradiation of a reflective photomask substrate 320 with an absorbing material 330 atop substrate 320, with the laser light focused just above the surface of the materials.
Figure 3B:
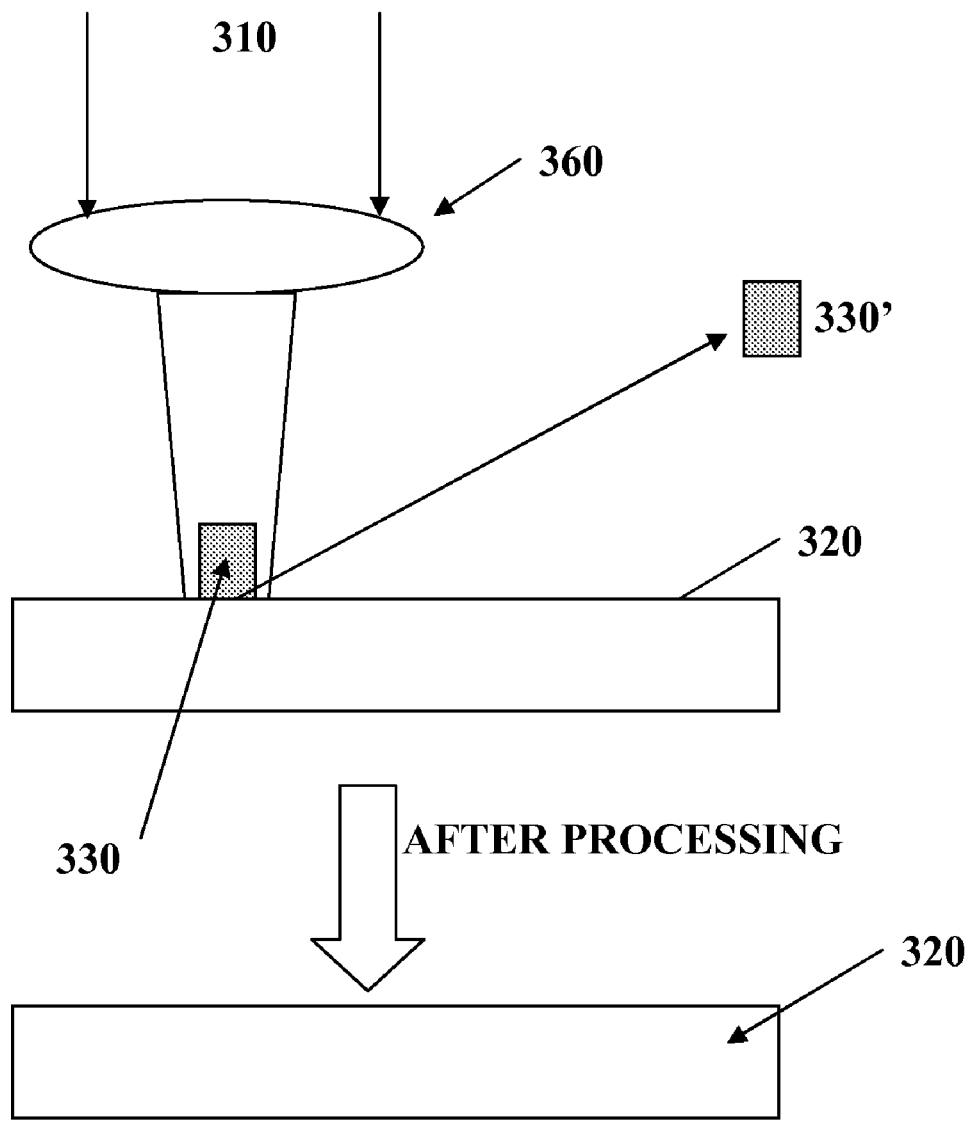
FIG. 3B represents the irradiation of a reflective photomask substrate 320 with an absorbing material 330 atop substrate 320, with the laser light focused directly on or near the surface of the materials.

One aspect of the above embodiment, depicted in FIGS. 3A and 3B, provides a method of repairing photomasks having two or more regions of differing reflectivity at the wavelength of the incident laser light pulses used for repair. Such a mask might include substrate 320, intended for a lithographic process, which may be highly reflective at a particular wavelength of laser light pulses 310.

Substrate 320 may then be covered by a second region of patterned material 330 that may be substantially less reflective (or absorbing) at the chosen wavelength. The pattern of the absorbing material may be, for example, intended for lithographic transfer to a semiconductor wafer used for creating an integrated circuit. The wavelength of the laser pulses 310 used to repair defects can be tuned to maximize an absorption difference between the highly reflective substrate 320, and lower reflectivity patterned absorber 330. Any defects 330' in patterned absorber 330 may then be selectively removed by the process of laser ablation without ablating, removing or damaging substrate 320. Pulse durations on the order of only one or a few femtoseconds may be required under some conditions to effect repair. As shown in FIG. 3A, laser light 310 may be focused through lens 360 at focal plane 380 just above the surface of substrate 320 and patterned material 330, or, as illustrated in FIG. 3B, the laser may be focused on or near the surface of patterned material 330, for example.

A prime candidate for next generation lithography (NGL) for manufacturing future integrated circuits on Si includes the use of extreme ultraviolet (EUV) lithography. EUV lithography operates at a wavelength of about 13 nm. Instead of a transmissive photomask, used in present lithographic printing technology, EUV lithography employs a reflective photomask patterned with an absorber resident on top of the reflective coating.

Figure 4:
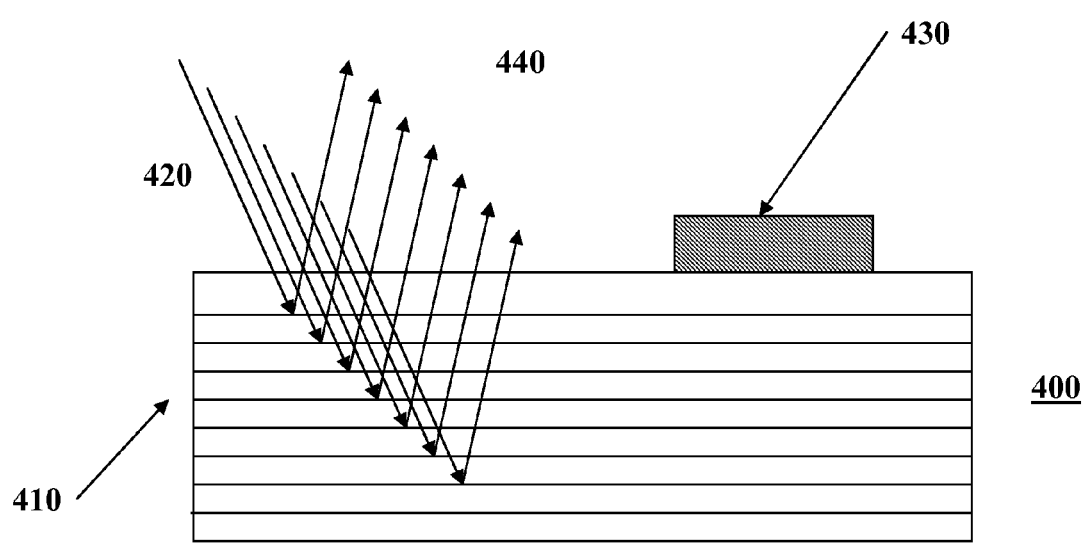
FIG. 4 displays, schematically, a side view of a photomask including a multilayered reflective substrate having an absorbing or non-reflective patterned material on a surface of the multilayered reflective substrate.

Turning to FIG. 4, one implementation of an EUV photomask 400 includes a high quality multilayer substrate coated with alternating layers of materials having thicknesses optimized to create an interference pattern at the specific wavelength of incident laser light pulses 420. This interference pattern results in enhanced reflectivity at the specific wavelength. Once the reflective layer is produced, the actual circuit pattern may be created by depositing non-reflective or absorbing material 430 atop the reflective coating 410, and then patterning absorbing material 430. Reflected EUV light 440 will transfer the pattern to a resist coated semiconductor wafer (not shown), in a process similar to present technology. As is the case for almost all photomask manufacturing, patterning of mask 400 itself is virtually never perfect. Defects in the form of excess absorber 430 occur. Since it is exceptionally expensive to create photomask 400 of this type and photomasks, in general, and since such costs are expected to increase with circuit complexity, it becomes critical to repair such defects by removing any unwanted or excess absorber 430.

Conventional photomask technology involves the patterning of Cr on fused silica. Repairs of Cr defects may be carried out by ablating the excess Cr with a laser. In this process, Cr is removed when short pulses of laser light in the visible or UV wavelength regions are focused on the defect. The underlying fused silica is substantially less light absorbing than the overlying Cr. Hence, Cr can be removed in a non-thermal process without damaging the underlying fused silica, because the ablation threshold for Cr is much lower than that for non-absorbing glass. This contrast or absorption difference between the fused silica glass and Cr allows Cr to be removed without affecting the glass substrate.

To achieve contrast in the repair of reflective EUV photomasks, however, a new approach is required. At visible and even UV wavelengths, where conventional photomask repair technology operates, absorber 430 and substrate 410 of EUV photomask 400 will both absorb the incident laser light and ablate. Without a mechanism to provide absorption contrast between patterned absorber 430 and underlying reflective substrate 410, repair is impossible. Hence present technology cannot be used to repair EUV photomask 400.

To solve this problem, ablation may be carried out at the wavelength where the substrate is highly reflective. The problem has not been solved to date due to the lack of a source of pulsed laser light at 13 nm (or other important EUV wavelengths), which has sufficient intensity and sufficiently short time duration to cleanly ablate solid material. With a sufficiently intense source of vacuum UV or EUV femtosecond light pulses, the absorber can be removed. If the ablating light intensity is judiciously chosen to have energy sufficient to remove the absorber, but lower energy than the ablation threshold of the reflective substrate, the defect can be removed with high resolution, leaving an undamaged reflective substrate behind.

Figure 5A:
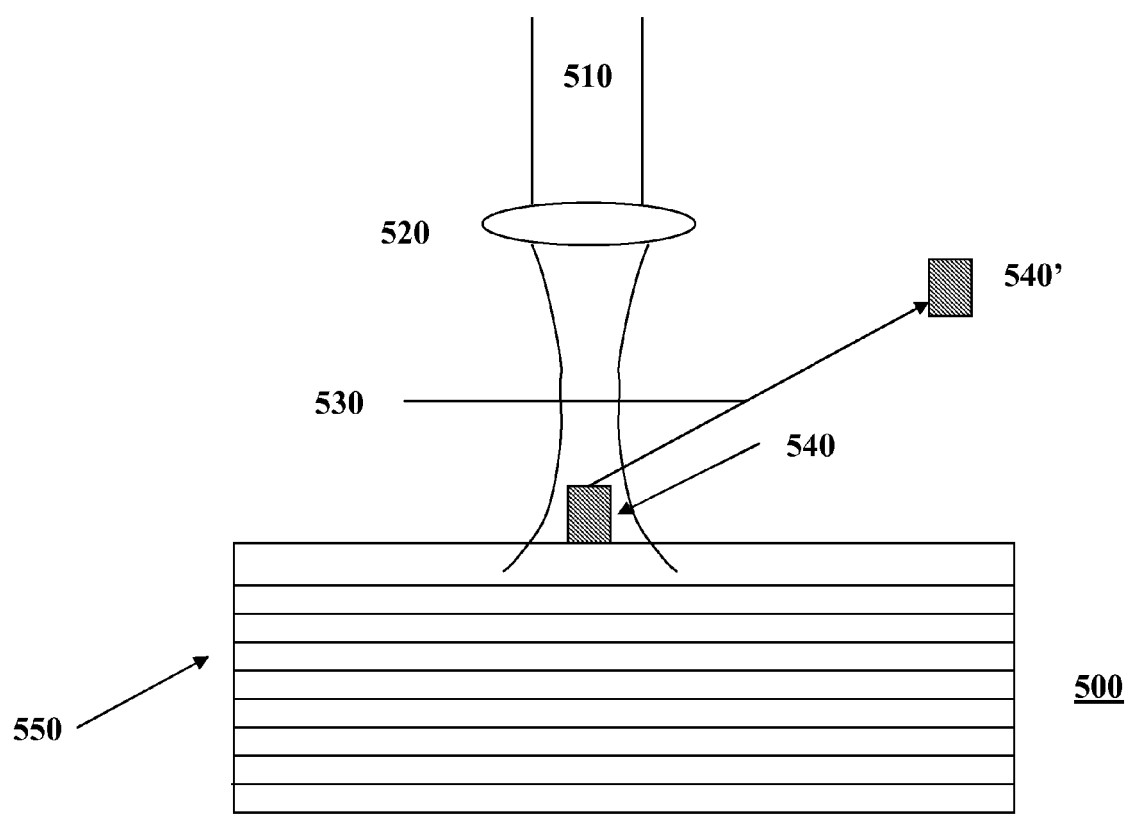
FIG. 5A displays a technique of focusing the incident light above an absorbing or non-reflective defect to ablatively remove it while minimizing any damage to the substrate.
Figure 5B:
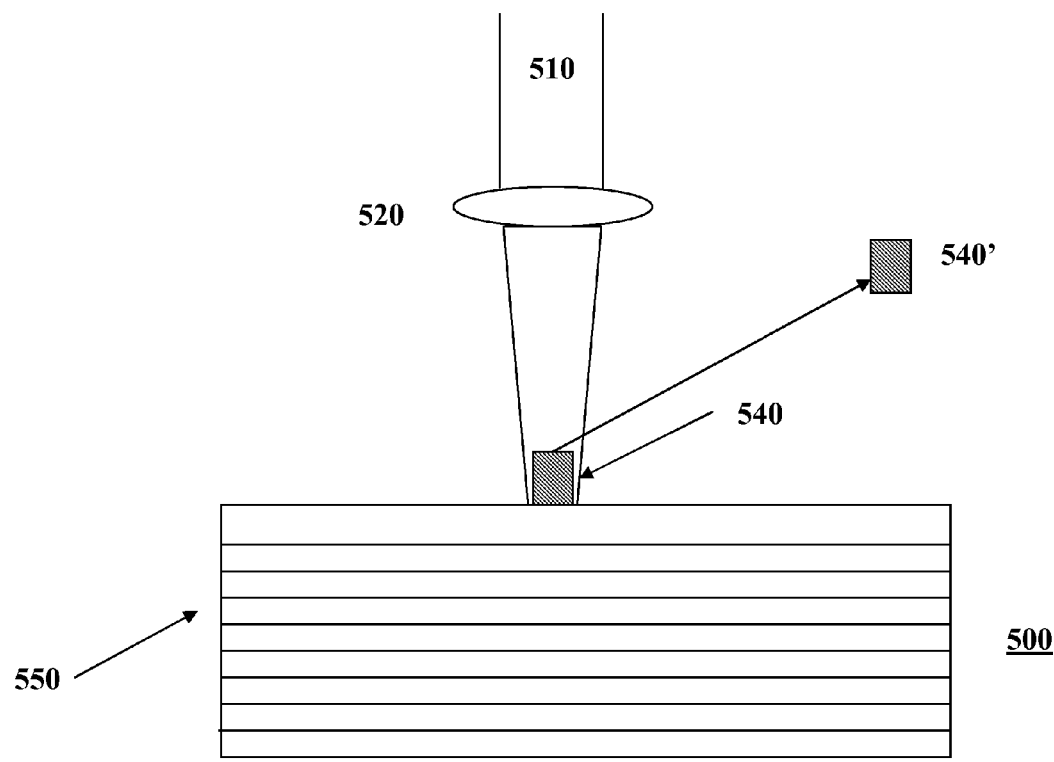
FIG. 5B displays a technique of focusing the incident light directly on or near an absorbing or non-reflective defect to ablatively remove it while minimizing any damage to the substrate.

Reflective photomask 500 is depicted in FIGS. 5A and 5B. In this regard, and as illustrated in FIG. 5A, when laser light pulses 510 are directed through lens 520 and focused at focal plane 530 just above the surface of substrate 550, defect 540 may be removed from substrate 550. Substrate 550 may be a multilayered reflective substrate, as discussed above. Removed defect 540' may be removed from substrate 550 without loss of reflectivity, pitting, or infliction of any damage to substrate 550. Therefore, defects in the patterned absorber atop the reflective substrate can be repaired by focusing an intense ultrashort duration laser pulse above the defect, in order to ablatively remove the defect, without damaging the underlying reflective mask. Alternatively, as depicted in FIG. 5B, the laser pulse may be focused on or near the surface of substrate 550.

Figure 6:
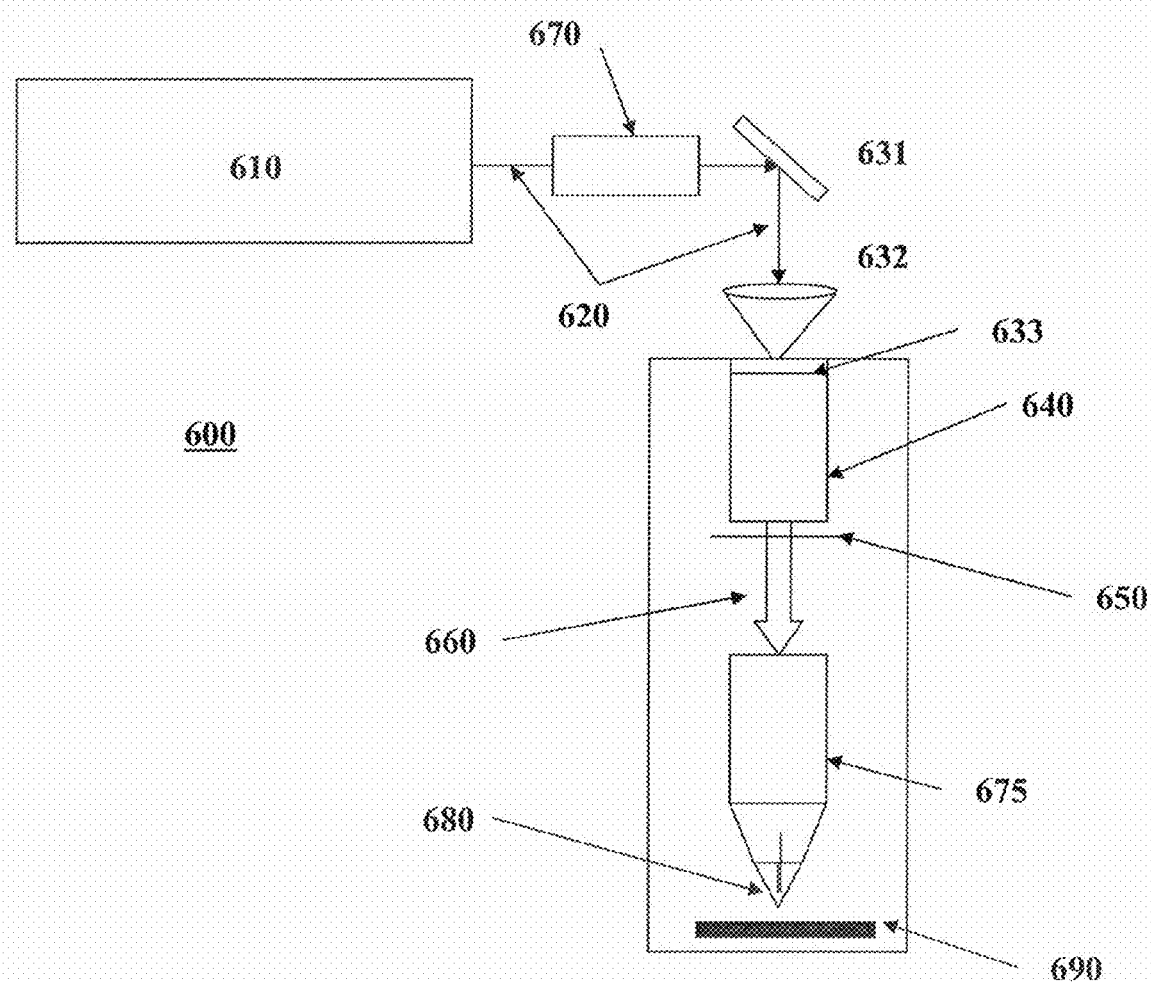
FIG. 6 is a schematic depiction of an embodiment of a repair tool for reflective photomasks which is associated with the generation and focusing of 13 nm extreme ultraviolet light onto a reflective photomask.

The repair process using the exemplary apparatus 600 in FIG. 6 includes several steps. As illustrated in FIG. 6, laser light pulses 620 from amplified femtosecond laser 610, typically operating at 800 nm at a repetition rate of 1 kHz, is focused through an optical pathway including, for example, beam control unit 670, mirror 631, focusing lens 632, and window 633 into a rare gas harmonic converter cell 640 containing, for example, gases such as Kr, Ar, Ne or He. The interaction of the intense laser light 620 and the gas in cell 640, along the focal plane of the laser system, is sufficient to produce harmonics of the fundamental 800 nm wavelength. Individual harmonics may be chosen by using filter 650. Filter 650 can be a series of multilayer coated mirrors which reject all but the desired harmonic wavelength 660. Other selective wavelength filters may include reflective diffraction gratings, and thin metal foils, for example. Additionally, desired harmonics may be selected by tuning of the harmonic gas pressure in cell 640, or by tuning other aspects of the light generation process including, for example, using beam control unit 670. Beam control unit 670 may also contain diagnostic equipment for evaluating the performance of laser apparatus 600.

In one aspect of this embodiment, the selected harmonic of laser light comprises 13 nm (EUV) laser light, and in another aspect, the selected harmonic of laser light may comprise 193 nm, 157 nm, or other important harmonic wavelengths.

In particular, 13 nm light is the 61st harmonic of the 800 nm radiation. Efficiency of the harmonic generation process can be as low as $1\times10^{-8}$ or as high as $1\times10^{-5}$ when phase matching approaches are employed. This may produce as much as 100 pJ to 1 nJ of light energy at the 61 st harmonic. A beryllium window or other appropriate filter material 650 may be used to filter out the fundamental 800 nm light component of laser light 620, permitting only the harmonic light 660 to be transmitted. In addition, phase matching approaches can be used to predominantly produce the 13 nm harmonic radiation of interest.

Once harmonic light 660 is produced, it can be focused to a diffraction limited spot 680 by reflective microscope objective 675. Spot 680 may have a diameter well below 25 nm. By carefully choosing the intensity, selected absorber material on photomask 690 can be removed without damaging the underlying reflecting substrate.

In terms of the particular wavelength or wavelengths chosen, lithographic printing of integrated circuitry on semiconductor wafers is generally carried out at specific wavelengths that are generated by efficient, high intensity excimer laser light sources, for example. Current lithographic printing utilizes the 248 nm and 193 nm emissions from KrF and ArF excimer lasers, respectively. The drive to produce ever smaller feature sizes on semiconductor wafers necessitates the move to increasingly shorter wavelengths for lithographic printing. To move beyond 193 nm lithography, 157 nm F2 excimer lasers may be employed. Beyond this, technology employing multilayer reflective mirrors dressed with a patterned absorber, illuminated at a wavelength of 13 nm continues to be developed. While 248 nm and 193 nm are deep ultraviolet wavelengths (DUV), 157 nm light is in the vacuum ultraviolet (VUV), since this light is absorbed strongly in air. Laser light at 13 nm has been coined "extreme UV" (EUV) light, but is also VUV light as well.

When a photomask is repaired, a number of criteria set by the lithographer must be met before the mask is considered successfully repaired. If a defect consisting of excess absorber must be removed, then the "repaired" region must exhibit typically better than 95% of the transmission or reflectivity of a pristine, unrepaired region. If an improperly "repaired" defect results in poor reflectivity or transmission, then the flux of light (248 nm, 193 nm, 157 nm, 13 nm) transmitted or reflected from this region may insufficiently expose the photoresist on the semiconductor wafer. Resultant residual resist on the semiconductor wafer will affect subsequent wafer processing and produces a defect on the chip. The same issues apply to line edge placement; tolerances in the degree of line edge variation after repair are designed to minimize the risk of transferring a defect to the chip.

In various aspects of the above embodiments of the invention, in order to provide a more reliable mask for increased production yield and less downtime, a defect may be removed while maintaining at least 95% of the original reflectivity of the substrate in the defect region of the substrate, and may maintain at least 98% of the original reflectivity of the substrate in the defect region. Alternatively, a reflectivity under the removed material may be within 5% of a reflectivity of the reflective substrate in a region in which no material has been removed, or the reflectivity under the removed material may even be within 2% of a reflectivity of the reflective substrate.

Conventional laser ablation for mask repair is typically carried out with nanosecond pulses of laser light. Nanosecond laser ablation is characterized by absorption of the laser light which heats, melts and evaporates the metal. This process produces molten metal which splatters onto other parts of the mask. Thermal diffusion substantially degrades the spatial resolution and damages the underlying substrate producing pitting and phase errors. Conversely, when light pulses in the femtosecond (fs) range are employed, the metal is converted into a plasma on a time scale significantly shorter than the time it takes for the excited electrons to convert their energy into heat. This "electron-phonon" coupling time is approximately 1 picosecond (ps) in most metals. Since femtosecond pulses convert the metal directly into a plasma without substantial heat generation, diffraction limited spatial resolution (and even better) may be achieved. Picosecond light pulses may also be effective, but include a thermal component which degrades the ablation process. By using femtosecond pulses, the thermal component to the ablation process is virtually nonexistent, resulting in clean ablation and removal of defects. This feature may provide benefits in photomask repair since the light absorbing metal can be surgically removed without splatter (i.e., there is no molten metal created), and little creation of heat in the substrate. In the case of a reflective photomask, the patterned absorber sitting atop the reflective substrate absorbs the laser pulse and is removed while the underlying reflective substrate reflects the laser light and is not damaged.

The various embodiments and aspects of the invention discussed above may include controlling a pulse width of the laser pulses to have a pulse duration of less than 10 picoseconds, less than 1 picosecond, less than 200 femtoseconds, or less than 50 femtoseconds, to ensure accurate control of the laser energy presented to the substrate and patterned material, and to reduce any damage to adjacent structure which is not to be ablated or removed.

The various embodiments of the invention discussed above may have aspects which include a substrate which is reflective in a region of light from 1 micron to 400 nm, 100 nm to 200 nm, 200 nm to 400 nm, 10 nm to 100 nm, or 1 nm to 10 nm to allow use in specific applications.

The various embodiments and aspects of the invention discussed above may also include tuning a wavelength of the laser pulses to be in a region from 157 nm to 1 micron, 13 nm to 157 nm, or less than 13 nm.

The various embodiments and aspects of the invention discussed above may also include ablating the defect all at once, or layer by layer.

Further, the laser light may be focused directly on the defective (photomask) material to be removed, or may be focused above the surface of the substrate. In a recently issued IBM U.S. Pat. No. 6,333,485, the entire contents of which are incorporated herein by reference, it was demonstrated that focusing femtosecond pulses of laser light slightly above the photomask being repaired significantly reduces any residual optical damage to the substrate. In a typical ablation process, the focal plane of the laser light is at or below the plane of the material being ablated. But for photomask repair, the intention is to remove an absorbing material sitting atop a transmissive or reflective substrate and to minimize any possible damage to the substrate. It can be beneficial to locate the focal plane of the ablating laser pulse slightly above the surface to ensure that the light rays are divergent, rather than convergent at the point where they interact with the substrate. In this manner, the light intensity is decaying as the pulse traverses the underlying substrate, thus minimizing possible damage to the substrate or photomask.

It will be obvious that the various embodiments of the invention discussed above may be varied in many ways. Such variations are not to be regarded as a departure from the spirit and scope of the invention, and all such modifications as would be obvious to one skilled in the art are intended to be included within the scope of the following claims. The breadth and scope of the present invention is therefore limited only by the scope of the appended claims and their equivalents.

What is claimed as new and desired to be protected by Letters Patent of the United States is:

1. An apparatus for repairing a defect on a reflective photomask, the apparatus comprising:
   a laser capable of providing femtosecond pulse width laser light;
   a harmonic conversion cell optically coupled to the laser;
   a filter for blocking a fundamental wavelength and passing a selected harmonic of the laser light;
   an objective lens arrangement configured to provide the selected harmonic of the laser light onto the reflective photomask; and
   a control unit operatively connected to the laser to control an ablation of the defect on the reflective photomask,
   wherein the selected harmonic comprises UV laser light and wherein the control unit provides an absorption contrast between a patterned absorber and an underlying reflective substrate,
   wherein the UV laser light comprises 13 nm light.

2. The apparatus of claim 1, wherein the filter comprises a rare gas cell.

3. The apparatus of claim 1, wherein the control unit controls an energy level of the laser light provided onto the reflective photomask.

* * * * *